(12) United States Patent
Nakajima

(10) Patent No.: US 7,124,311 B2
(45) Date of Patent: Oct. 17, 2006

(54) METHOD FOR CONTROLLING PROCESSOR IN ACTIVE/STANDBY MODE BY THIRD DECODER BASED ON INSTRUCTIONS SENT TO A FIRST DECODER AND THE THIRD DECODER

(75) Inventor: Hiroyuki Nakajima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 423 days.

(21) Appl. No.: 10/446,512

(22) Filed: May 28, 2003

(65) Prior Publication Data

US 2003/0226051 A1 Dec. 4, 2003

(30) Foreign Application Priority Data

May 30, 2002 (JP) ............................. 2002-157469

(51) Int. Cl.
*G06F 1/28* (2006.01)

(52) U.S. Cl. ..................... 713/323; 713/300; 713/323; 713/324

(58) Field of Classification Search ................ 713/310, 713/321, 322, 323, 324, 330
See application file for complete search history.

(56) References Cited

U.S. PATENT DOCUMENTS

| 5,204,957 A | * | 4/1993 | Wilkie et al. ................. 712/38 |
| 5,495,617 A | * | 2/1996 | Yamada ....................... 713/323 |
| 5,724,599 A | * | 3/1998 | Balmer et al. ................ 712/43 |
| 2002/0050998 A1 | * | 5/2002 | Sasaki ......................... 345/474 |
| 2005/0197880 A1 | * | 9/2005 | Walsh et al. .................... 705/8 |
| 2005/0220109 A1 | * | 10/2005 | Sudo et al. ................. 370/392 |

FOREIGN PATENT DOCUMENTS

| EP | 1 160 697 A2 | 12/2001 |
| EP | 1 160 697 A3 | 4/2003 |
| JP | 63-247861 | 10/1988 |
| JP | 04-175974 | 6/1992 |
| JP | 09-138716 | 5/1997 |
| JP | 2000-235489 | 8/2000 |

OTHER PUBLICATIONS

European Search Report of Dec. 23, 2004.
CoWare, Inc., *Flexible Platform-Based Design With the CoWare N2CTM Design System*, Oct. 2000, pp. 1-9.
Arnout, Guido, *C for System Level Design*, 1999, pp. 1-4.
SystemC.org, *Overview of the Open SystemC Initiative*, 1999, pp. 1-2.
Nishitani, Takao, *An Approach to a Multimedia System on a Chip*, 1999, pp. 13-22.

(Continued)

Primary Examiner—Thomas Lee
Assistant Examiner—Malcolm Cribbs
(74) Attorney, Agent, or Firm—Darryl G. Walker; Bradley T. Sako

(57) ABSTRACT

In a system large scale integrated circuit (LSI) according to one embodiment, management of the power supply, and the like, of a dedicated instruction processor can be carried out according to an instruction issued to a basic instruction processor at high speed. Further, the operational state of a dedicated instruction processor may be readily obtained by a basic instruction processor. In such a system LSI, a system controller (14) can include an instruction decoder (16) that decodes an instruction fetched by a basic instruction processor (11) and generates a decoder output. Such a decoder output can control a second power supply controlling unit (51), a second clock signal generating unit (52), a second program counter (53), and a second conditional flag (54) for a dedicated instruction processor (12).

35 Claims, 7 Drawing Sheets

OTHER PUBLICATIONS

Suzuki et al., *A Rapid Prototyping Method for Top-down Design of System-on-Chip Devices Using LPDAs*, 1997, pp. 9-14.

Khare et al., *V-SAT: A Visual Specification and Analysis Tool for System-on-Chip Exploration*, Apr. 2001, pp. 263-275.

Ernst, et al., *Hardware-Software Cosynthesis for Microcontrollers*, 1993, pp. 64-75.

Cesario, et al., *An XML-based Meta-model for the Design of Multiprocessor Embedded Systems*, Oct. 2000, pp. 75-82.

Jozwiak, Lech, *Quality-driven Design in the System-on-a-Chip Era: Why and How?*, Apr. 2001, pp. 201-224.

Japanese Patent Office Action of Oct. 31, 2005.

English Translations of the indicated portions of the above-referenced Japanese Office Action.

* cited by examiner

METHOD FOR CONTROLLING PROCESSOR IN ACTIVE/STANDBY MODE BY THIRD DECODER BASED ON INSTRUCTIONS SENT TO A FIRST DECODER AND THE THIRD DECODER

TECHNICAL FIELD

The present invention relates generally to a system large scale integrated circuit (LSI), a method of designing the same, and program therefor, and more particularly to a system LSI designed with a software/hardware cooperative design system using behavior synthesis, a method of designing the same, and program therefor.

BACKGROUND OF THE INVENTION

In recent years, integrated circuits have been realized that can provide essentially all circuit functions of a desired system on one chip. Such an integrated circuit has been referred to as a "System On a Chip" (SOC) or system large scale integrated circuit "System LSI". As semiconductor manufacturing process have enabled the scaling down of circuit features, there has been a jump in the number gates integrated on a system LSI, as well as an increase in the throughput (e.g., processing capability/speed) of a system LSI.

A system LSI can be used in a number of applications including but not limited to image processing, encryption/decryption processing, filtering and/or encoding/decoding processes. Of course, such applications can include various types of input/output signals, processing algorithms, and timing requirements. Increasingly, system LSIs can provide more complicated processing with faster processing times. For this reason, recent system LSIs are increasingly being employed for signal processing applications.

FIG. 6 shows a conventional design flow for a system LSI with a software/hardware cooperative design system. The flow of FIG. 6 shows a cooperative design system that includes an algorithm description 1. An algorithm description 1 can represent a system LSI design in the form of a high level language, such as a general purpose program language like C, as but one example. An algorithm description 1 may also be in the form of a dedicated operation level description language that can be converted into a lower level description, such as a register transfer level (RTL) description 7. As is well understood, an RTL description 7 may be realized into hardware with hardware resources having a memory unit, such as a register, and an execution processing unit such as an adder.

All the functions of a system LSI are described in the form of an operation description in the algorithm description 1. It is known that a processing speed for a system LSI can be related to the proportion of the design realized in hardware versus the proportion realized in software. That is, if a greater part of a system LSI is realized as hardware, a processing speed can be faster. However, such an approach can limit the flexibility of a resulting device, as it can be difficult to change functionality after the device is manufactured. In addition, realizing a greater part of a system LSI in hardware can result in a larger overall device, thus manufacturing costs can be higher. On the other hand, if a greater part of a system LSI is realized as software, then changing the functionality of the device may be easier, and a resulting device can be smaller. However, software can be inherently slower than hardware, so a resulting device may have reduced processing speed as compared to one in which a greater part of the system LSI is realized as hardware.

Referring still to FIG. 6, due to the above constraints, a conventional software/hardware cooperative design system may divide system LSI functions into those realized as hardware and those realized as software (step S201). Such a division of functions may be based on predetermined considerations such as circuit scale (e.g., size), processing time, and cost.

If hardware resources are designed from the start (e.g., from "scratch"), development cost may be too high, and development time may be too long. For this reason, hardware components may be in the form of hardware "macros" composed of hardware intellectual property (IP). Such hardware IP can be accumulated as reusable design components, which can represent IP of excellent quality and in wide use that may be readily incorporated into a system LSI structure.

In the arrangement of FIG. 6, hardware can be designed on the basis of a basic instruction processor 11, such as a microprocessor for carrying out general purpose arithmetic operations, and a dedicated instruction processor 12 for executing particular processing according to a given application, such as the processing of an input/output signal. In general, a designed processor in hardware IP form can be used as a basic instruction processor 11. Thus, a basic instruction processor 11 can be a design in RTL form created by a group specializing in processor design, which may be different from a group which designs a system LSI. Such basic instruction processor 11 can be provided with a description for simulation 8a.

If a basic instruction processor 11 is decided upon, a process may continue with a design of a dedicated instruction processor 12. A dedicated instruction processor 12, like a basic instruction processor 11, may be designed on the basis of an RTL design. Alternatively, a dedicated instruction processor 12 may be designed using an behavior synthesis. In an behavior synthesis design, functions of a dedicated instruction processor 12 can be described in the form of a high level language (step S202). From such a high level representation, an behavior synthesis (step S203) can obtain a dedicated instruction processor RTL description 7b and a description of such a process for simulation 8b.

Once a dedicated instruction processor RTL description 7b is obtained, such a description can be checked to determine if the dedicated instruction processor 12 can be formed within predetermined circuit scale (e.g., size) restrictions (step S204). If a predetermined circuit scale will be exceeded (NG), a process can return to step S201, to repeat the system LSI design steps. On the other hand, if such a check indicates circuit scale is satisfactory (OK), an RTL description of a system LSI can be formed that includes a basic instruction processor RTL description 7a and dedicated instruction processor RTL description 7b connected to one another by a bus portion RTL description 7c (step S205). It is understood that a basic instruction processor RTL description 7a and dedicated instruction processor RTL description 7b, as shown by items 11 and 12 can be designed to connect to one another through a predetermined bus interface.

Next, in the software design, an application program 9 and a device driver 17 may be described with a high level language (step S206). A device driver 17 may be for driving the dedicated instruction processor 12 and basic instruction processor 11. An application program 9 and device driver 17 are converted into a machine language instruction set 10 by an assembler and/or compiled by a compiler (step S207).

The operation of a system LSI design may then be simulated. In particular, descriptions for simulation of a dedicated instruction processor 8b, basic instruction processor 8a, and bus portion 8c can be brought together in a coupling description for simulation 8. A coupling description for simulation 8 and machine language instruction set 10 can then be subject to an instruction simulation. In this way, a simulation for a software design can be carried out under the same environment as a system LSI structure (step S208).

In an instruction set simulator, hardware and software are simulated to ensure that the design of the software and hardware has no errors. Step S208 may also include measuring a time (e.g., speed) performance and power consumption characteristics of a system LSI during actual use. These performance results can be checked to see whether they meet predetermined criteria (step S209). If a result of such a check indicates the criteria are not met (NG), a process can return to a step S201 to re-execute a division of functions. On the other hand, if a result of such a check indicates the criteria are met (OK), the design of the system LSI is complete. Thereafter, a basic instruction processor RTL description 7a, dedicated instruction processor RTL description 7b, and bus portion RTL description 7c are logically composed to form actual gate structures for the system LSI.

FIG. 7 shows a configuration of a processor portion of a system LSI that can be obtained according to the above mentioned conventional method of design. The conventional processor portion is shown in a block diagram, and includes a basic instruction processor 11, a dedicated instruction processor 12, an interprocessor communication bus 13, and a system controlling unit 15. The basic instruction processor 11 can include a power supply controlling unit 41, a clock generating unit 42, a program counter 43, a conditional flag 44, an instruction fetch register 45, and an instruction decoder 46. In a similar fashion, the dedicated instruction processor 12 can include a power supply controlling unit 51, a clock generating unit 52, a program counter 53, a conditional flag 54, an instruction fetch register 55, and an instruction decoder 56.

The basic instruction processor 11 and dedicated instruction processor 12 transmit and receive data to and from each other through the interprocessor communication bus 13. The system control unit 15 supplies a power supply and basic clock signal to the basic instruction processor 11 and dedicated instruction processor 12.

In the basic instruction processor 11, a power supply controlling unit 41 can receive a power supply input from the system control unit 15. The power supply controlling unit 41 can supply or not supply the power supply to internal circuits of the basic instruction processor 11 according to an ON-OFF control. The clock generating unit 42 can generate a clock signal of a predetermined frequency according to a basic clock signal input from the system control unit 15. The clock signal of the clock generating unit 42 can be provided internal circuits of the basic instruction processor 11. Program counter 43 specifies the address when an instruction fetch register 45 reads out an instruction. Instruction fetch register 45 reads out an instruction from a storage device, such as a program memory (not shown), and stores such an instruction for decoding and execution. The instruction decoder 46 refers to the instruction fetch register 45 and decodes the fetched instruction to thereby execute the instruction.

As noted above, portions of the dedicated instruction processor 12 have the same configuration as those of the basic instruction processor.

The dedicated instruction processor 12 executes processing when necessary. Thus, when dedicated instruction processor 12 functions are not needed, the dedicated instruction processor 12 can enter a standby mode of reduced power consumption. To enter a standby mode, the instruction decoder 46 of the basic instruction processor 11 refers to the instruction fetch register 45 and decodes the fetched instruction to thereby execute the instruction. Such an instruction indicates that a power supply and clock signal for the dedicated instruction processor 12 are to be stopped. And the basic instruction processor 11 transmits a command to the dedicated instruction processor 12 through interprocessor communication bus 13. In response to such a command, the instruction decoder 56 of the dedicated instruction processor 12 refers to the instruction fetch register 55 and decodes a fetched instruction to thereby execute the instruction corresponding to the command. The dedicated instruction processor 12 stops the supply of the power supply from power supply controlling unit 51 to internal circuits of the dedicated instruction processor 12, and stops the supply of a clock signal from clock generating unit 52 to internal circuits of the dedicated instruction processor 12. In this way, the dedicated instruction processor 12 can be placed into the standby mode.

A dedicated instruction processor 12 can proceed from a standby mode to an activation mode, in which a dedicated instruction processor 12 can process data. To proceed to the activation mode, a basic instruction processor 11 can transmit a command that indicates a change to the activation mode to the dedicated instruction processor by way of interprocessor communication bus 13. The dedicated instruction processor 12 will then control the second power supply controlling unit 51 and the second clock generating unit 52 in a bootstrap fashion such as an interrupt to enable the operation mode to proceed to the activation mode.

In a conventional system LSI like that described above, upon the input of a command from basic instruction processor 11, dedicated instruction processor 12 can control power supply controlling unit 51 and clock generating unit 52 to place the operation mode to either the activation mode or standby mode. Thus, in such an arrangement, basic instruction processor 11 monitors the operation state of the dedicated instruction processor 12 in order to determine whether the dedicated instruction processor 12 should be maintained in one mode (e.g., standby or activation), or switched to another mode (e.g., activation or standby). In response to such information, the basic instruction processor 11 issues the command.

A drawback to such a conventional arrangement is that it takes the good amount of time that passes between the reception of the command to enter the standby mode and the actual point at which the standby mode is achieved. In particular, a certain amount of time is required for the basic instruction processor 11 and the dedicated instruction processor 12 to decode the instruction corresponding to such the command and control corresponding circuits to place them in the standby mode, and is required for the basic instruction processor 11 transmits the command to the dedicated instruction processor 12 through interprocessor communication bus 13. During such a time period, electric power must be consumed.

One particular application where such a drawback is a concern is mobile type terminals. In recent mobile type terminals, requests to control a power supply occurs frequently, as preserving battery life is an important feature. It follows that in such applications where power supplies a controlled frequently (e.g., modes are switched to and from a standby mode frequently), electric power consumed during such mode switching times cannot be ignored. Accordingly, there is a need to arrive at some way of shortening the time required to control a power supply.

In addition, if additional time is required to control a power supply, accurate control of a power supply may not be possible, and presents an obstacle to further increasing the high speed operation of a system LSI.

Furthermore, it is necessary for the system LSI is designed that the basic instruction processor 11 and the dedicated instruction processor 12 are designed with the upper level description. A drawback to such a conventional method of designing is that it doesn't take account for that. It is difficult to use the way of the both processor designed with the upper level description.

In light of the above, there is a need to provide a system LSI in which power supply management, or the like, of a dedicated instruction processor can be carried out at a higher speed than conventional approaches. In particular, it would be desirable to provide a system LSI in which a basic instruction processor can readily obtain the state of a dedicated instruction processor, and issue a command thereto for power supply management. It would also be desirable to provide a method for designing such a system LSI and provide a program for the same on a machine readable recording medium.

SUMMARY OF THE INVENTION

It is therefore an object of the present invention to provide a more improved system large scale integrated circuit (LSI).

It is another object of the present invention to provide the system LSI having an improved system controller between a basic instruction processor and a dedicated instruction processor.

It is another object of the present invention to provide the system LSI that includes a basic instruction processor, at least one dedicated instruction processor, a bus that connects the basic instruction processor and dedicated instruction processor, and a system controller that controls the basic instruction processor and the at least one dedicated instruction processor. The system controller can include a decoder that decodes instructions fetched by the basic instruction processor to control the operation of the at least one dedicated instruction processor. Such control may be by operation of each unit coupled to the dedicated instruction processor. For instance, the each unit means a power supply controlling unit, a clock signal generating unit, or program counter coupled to the at least one dedicated instruction processor.

In a system LSI like that described above, a system controller can decode an instruction issued to the basic instruction processor that is intended to control the dedicated instruction processor. As a result, control of a power supply and/or clock signal for a dedicated instruction processor may be carried out essentially immediately in response to such an instruction. This can allow for more precise power management of the system LSI.

According to one aspect of the embodiments, a system controller can further control the operation of the at least one dedicated instruction processor according to an operation conditional flag. Such an operation conditional flag can indicate the operational state of the at least one dedicated instruction processor. In such an arrangement, the state of a dedicated instruction processor can be ascertained through the system controller, making it easier to control the operation of the dedicated instruction processor from the basic instruction processor side.

According to another aspect of the embodiments, a system controller can further control the operation of the basic instruction processor according to an operation conditional flag that indicates the operational state of the at least one dedicated instruction processor. Such an arrangement can reduce or eliminate delays in processing, as a basic instruction processor may begin processing immediately following completion of a dedicated instruction processor operation, as the state of the dedicated instruction processor may be readily obtained from the operation conditional flag.

According to another aspect of the embodiments, a system controller can further include a power supply controlling unit, a clock signal generating unit, a program counter, and an operational conditional flag coupled to the at least one dedicated instruction processor. Such an arrangement is in contrast to conventional approaches that can include such units within the dedicated instruction processor. Further, such an arrangement allows such units to be more readily referred to, and/or directly controlled according to instructions issued from a basic instruction processor.

According to another aspect of the embodiments, a system controller can control the power supply of a system LSI. In particular, the system controller can control the time at which a power supply is provided to a dedicated instruction processor, the time at which a clock is generated for a dedicated instruction processor, and the time at which the program counter coupled to a dedicated instruction processor starts to count. In such an arrangement, during the initial activation of a system LSI, a power supply and clock signal may not be supplied to a dedicated instruction processor, as such a processor is not needed. Further, the power supply management of the dedicated instruction processor may be controlled on the basis of a command from the system controller. This can reduce wasteful power consumption.

According to another aspect of the embodiments, a system controller can control a switching of a dedicated instruction processor mode between an activation mode, in which processing is executed, and a standby mode, in which less power is consumed than in the activation mode. In such an arrangement, a dedicated instruction processor can be controlled at a faster speed than conventional arrangements that rely on command issued from external sources. Further, according to the present invention a number of lower power standby modes can be provided. For example, one standby mode can include a power supply and a clock signal being off, while another standby mode can include a power supply being on and clock signal being off. Of course other variations can be included.

According to another aspect of the embodiments, a system LSI can include a plurality of dedicated instruction processors. In addition, a system controller can independently control the switching of each dedicated instruction processor mode between an activation mode, in which processing is executed, and a standby mode in which less power is consumed than in the activation mode. Such independent control of multiple dedicated instruction processors can allow for finer control of power supply management than conventional approaches.

The present invention may also include a system LSI designing method. Such a designing method can include providing a description of a basic instruction processor at an algorithm level, providing a description of at least one dedicated instruction processor at an algorithm level, providing a description of a bus that connects the basic instruction processor and dedicated instruction processor at the algorithm level, and providing a description of a system controller at the algorithm level that controls the basic instruction processor and at least one dedicated instruction processor. The description of the system controller can include a description of a decoder that decodes instructions fetched by the basic instruction processor to control the operation of the at least one dedicated instruction processor. Such control can be by way of a power supply controlling unit, a clock signal generating unit, and program counter coupled to the at least one dedicated instruction processor. The method further includes composing the operations set forth in the description of the basic instruction processor, the description of the at least one dedicated instruction processor, and the description of the system controller to form an entire description thereof.

By describing a basic instruction processor, dedicated instruction processor, bus, and system controller at the algorithm level, a system controller can be flexibly designed according to requirements of the basic instruction processor and dedicated instruction processor.

According to one aspect of the embodiments, providing the description of the basic instruction processor includes accessing a preexisting processor design stored in a database. In addition, providing the description of a system controller includes providing at least a first portion of the description of the system controller by accessing at least a portion of a preexisting system controller design stored in the database. In addition, providing at least a second portion of the description of the system controller includes designing said portion of the description according to the description of the at least one dedicated instruction processor. Further, providing the description of the at least one dedicated instruction processor includes designing said descriptions of the at least one dedicated instruction processor according to the desired system LSI function.

In an arrangement like that above, a basic instruction processor and portions of a system controller can be formed from existing intellectual property (IP), while other portions of the system controller and dedicated instruction processor can be designed according to the system LSI application. Such an arrangement can shorten design time and/or allow for greater flexibility in the design of the system LSI.

According to another aspect of the embodiments, a system LSI designing method can include providing descriptions for a plurality of dedicated instruction processors by designing said descriptions of the dedicated instruction processors according to the desired system LSI function. Further, providing the description of the system controller includes providing at least a second portion of the description of the system controller by designing said portion of the description according to the description of each dedicated instruction processor.

In the above arrangement, a newly designed dedicated instruction processor can be added to an existing system LSI design that includes a preexisting basic instruction processor and one or more preexisting dedicated instruction processors.

According to another aspect of the embodiments, a system LSI designing method can include composing operations that further form a single description for simulation at a clock level for the basic instruction processor, at least one dedicated instruction processor, a bus, and a system controller, and verifying the operation of the system LSI according to the description for simulation and a machine language instruction set readable by the basic instruction processor and dedicated instruction processor of the description for simulation.

Such a verification step, like that above, can enable verification of a system LSI in which software is executed by the resulting system LSI hardware. This can allow processing time and power consumption characteristics to be verified, thus facilitating overall verification of the system LSI.

According to another aspect of the embodiments, a system LSI designing method can include the description of the basic instruction processor, the dedicated instruction processor, and the system controller being in a form from the group consisting of: the C language, an extended version of the C language, or an object oriented language.

According to another aspect of the embodiments, the steps of the system LSI designing method can comprise a computer program embodied on computer-readable medium executable on a computing system.

The present invention can include a system LSI that includes a basic instruction processor that executes general purpose arithmetic operations, at least one dedicated instruction processor that executes predetermined operations based on the application of the system LSI, and a system controller. The system controller can control the operational state of the dedicated instruction processor by decoding instructions stored in the basic instruction processor with a controller decoder external to the basic instruction processor.

According to one aspect of the embodiments, a basic instruction processor, at least one dedicated instruction processor, and a system controller can be in a form selected from the group consisting of: a register transfer language (RTL) description, a gate level description or an algorithm description.

According to another aspect of the embodiments, a system controller can include a controller decoder, and a basic instruction processor includes a first instruction decoder different than the controller decoder. Further, a dedicated instruction processor can include a second instruction decoder different than the controller decoder and the first instruction decoder.

According to another aspect of the embodiments, a system LSI may further include a power supply controlling unit that provides a power supply for the dedicated instruction processor. In addition, a controller decoder provides a decoder output that controls the power supply controlling unit.

According to another aspect of the embodiments, a system LSI may further include a clock generating unit that provides a clock signal for the dedicated instruction processor. In addition, a controller decoder provides a decoder output that controls the clock generating unit controlling.

According to another aspect of the embodiments, a system LSI may further include a program counter that provides a program count value for the dedicated instruction processor for accessing instructions. In addition, a controller decoder provides a decoder output that controls the program counter.

According to another aspect of the embodiments, a system LSI may further include a conditional flag that indicates the operational state of the dedicated instruction processor. Such operational states can be selected from the group consisting of: a power supply and clock signal for the dedicated instruction processor are both off, the power supply for the dedicated instruction processor is on and the clock signal for the dedicated instruction processor is off, the power supply and clock signal for the dedicated instruction processor are both on, a first operation is being executed by the dedicated instruction processor, a second operation is being executed by the dedicated instruction processor, and the operation of the dedicated instruction processor is on hold.

DETAILED DESCRIPTION OF THE EMBODIMENTS

The present invention will hereinafter be described in more detail on the basis of various particular embodiments and with reference to accompanying figures.

Figure 1:
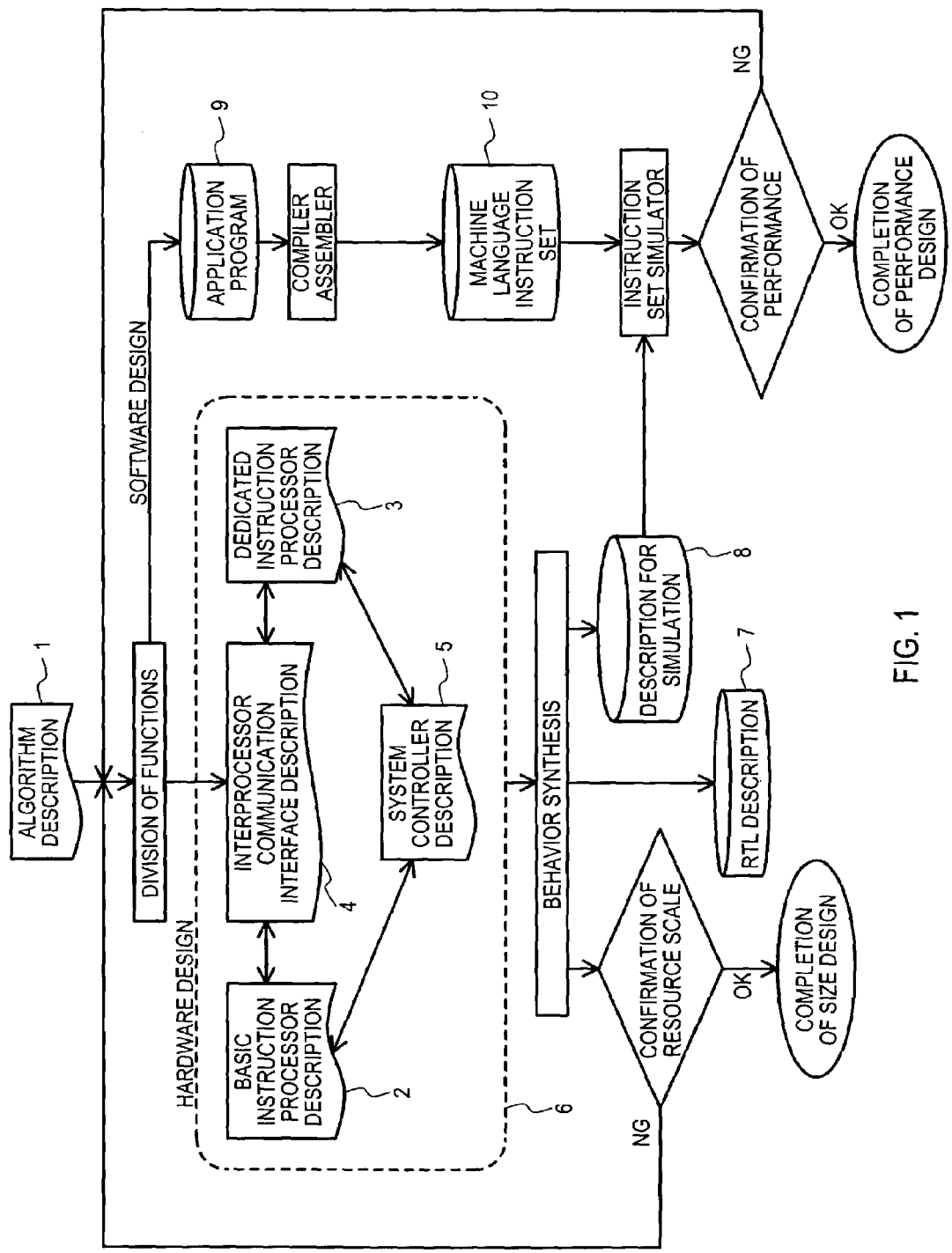
FIG. 1 is a block diagram showing a system for designing a system large scale integrated circuit (LSI) according to one embodiment that may execute a method of designing a system LSI according to another embodiment.
Figure 2:
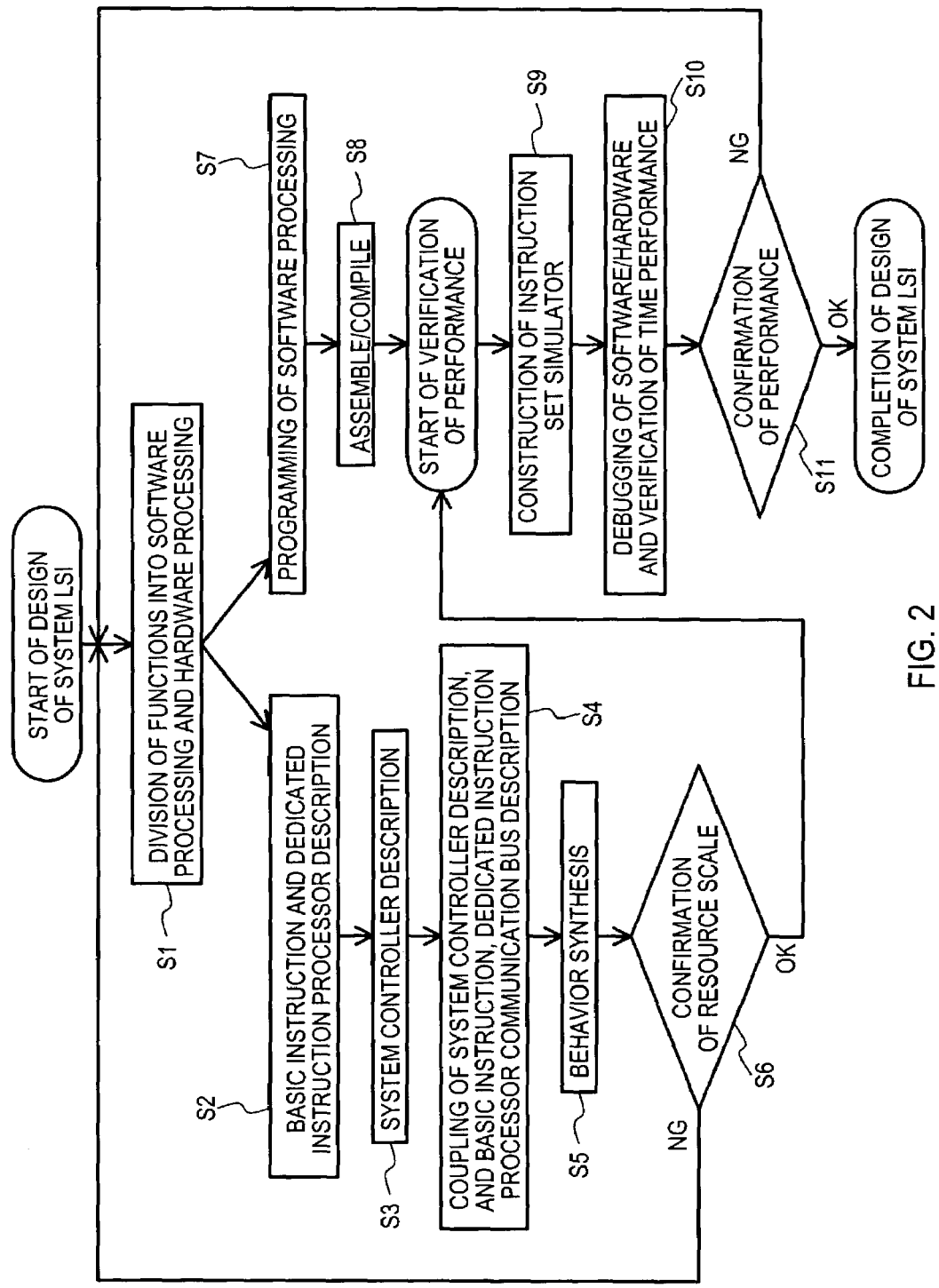
FIG. 2 is a flow diagram showing a method of designing a system LSI according to an embodiment.

FIG. 1 is a block diagram showing one example of a system for implementing a method of designing a system LSI according to one embodiment. FIG. 2 is a flow diagram showing a method of designing a system LSI according to an embodiment. A method of designing a system LSI will now be described with reference to FIGS. 1 and 2. This method, like the conventional method described above, is a software/hardware cooperative design system using behavior synthesis.

In the arrangement of FIG. 1, an algorithm description 1 can describe all the functions of a system LSI with a general purpose program language, such as C, or in a higher level language such as a dedicated operation level description language. Functions described by algorithm description 1 can be divided into a hardware portion and software portion. Such a division can be made based on considerations such as ease of changing a function specification, circuit scale (e.g., size), processing speed, and/or power consumption, as but a few examples (Step S1 in FIG. 2).

In the design of a hardware portion of a system LSI, the functions of a processor can be designed using a high level language. In the design of a software portion of a system LSI, an application program 9 can be designed that is adapted to run on a processor of the hardware portion of a system LSI.

In more detail, the design of a hardware portion of a system LSI, according to one embodiment, can include designing the functions of a dedicated instruction processor, for executing specific processing according to the specifications of a system LSI. In addition, the function of a basic instruction processor can be designed, for performing general purpose processing, along with an input/output portion of a system LSI (Step S2 of FIG. 2).

A resulting basic instruction processor description 2 may include only desired basic instruction functions from a library (not shown) in the form of a combination. A resulting dedicated instruction processor description 3 may describe desired dedicated instruction functions.

Next, and in contrast to conventional approaches, a system controller can be defined for controlling functions of a basic instruction processor and dedicated instruction processor such as power supply management and generation of a clock signal, for example (Step S3 of FIG. 2). A system controller may include a system control unit, an instruction decoder, a basic instruction processor controlling unit, and a dedicated instruction processor controlling unit. Such a system controller arrangement will be described in more detail at a later point herein, and can be defined by a system controller description 5.

In addition, an interprocessor communication interface description 4 can be defined, that corresponds to a bus through which a basic instruction processor and dedicated instruction processor can communicate information with each other.

A basic instruction processor description 2 and dedicated instruction processor description 3 can be connected to each other through an interprocessor communication interface description 4, and, in combination with a system controller description 5, can form a processor description 6 (Step S4 of FIG. 2).

Operations of processor description 6 can be composed with one another to obtain an RTL description 7, adapted for hardware implementation, as well as a description for simulation 8, for verifying the operation of the processor description 6 at the clock cycle level (Step S5 of FIG. 2). In other words, the behavior synthesis is used together with the basic instruction processor description and the dedicated instruction processor description to synthesis these processors and to form a lower level language description.

If a circuit scale (e.g., size) resulting from such an behavior synthesis does not meet resource scale restrictions (NG) (Step S6), a process can return to a Step S1, to design the system LSI over again at the point where functions are divided into a hardware portion and a software portion. On the other hand, if a resource check indicates such restrictions are met (OK), the configuration of a hardware portion (e.g., processor) of a system LSI can be considered completed with respect to hardware size.

In the design of a software portion of a system LSI according to one embodiment, an application program 9 can be described with a high grade language, or the like (Step S7) for execution on a processor portion of the system LSI. If the contents of the application program 9 are decided, the application program 9 can be converted into a machine language instruction set 10 by assembling by an assembler and compiling by a compiler (Step S8). A machine language instruction set 10 can be directly understood by a processor.

A machine language instruction set 10 and a description for simulation 8 (of a processor) can be applied to an instruction set simulator (Step S9). Such a step can determine if an error exists in the design.

In an instruction set simulator, the processor description 6 and application program 9 can be debugged, if necessary. In addition, the time (e.g., speed) performance and power consumption characteristics can be measured (Step S10 of FIG. 2). Such time performance and power consumption characteristic may then be checked against predetermined restrictions (Step S11 of FIG. 2). If such a check does not meet the predetermined restrictions (NG), a process can return to a Step S1, to design the system LSI over again at the point where functions are divided into a hardware portion and a software portion. On the other hand, if such a check indicates the restrictions are met (OK), the configuration of a processor and an application program to run on the process of the system LSI can be decided. Therefor a designing method of this invention has a feature that the behavior synthesis is used together with the basic instruction processor description and the dedicated instruction processor description to synthesis these processors.

One skilled in the art would recognize that any of an RTL description 7, description for simulation 8 may be realized as data on machine readable media. Further, any of an application program 9, machine language instruction set 10, or method shown in FIG. 2 can be realized as computer programs on machine readable media.

Figure 3:
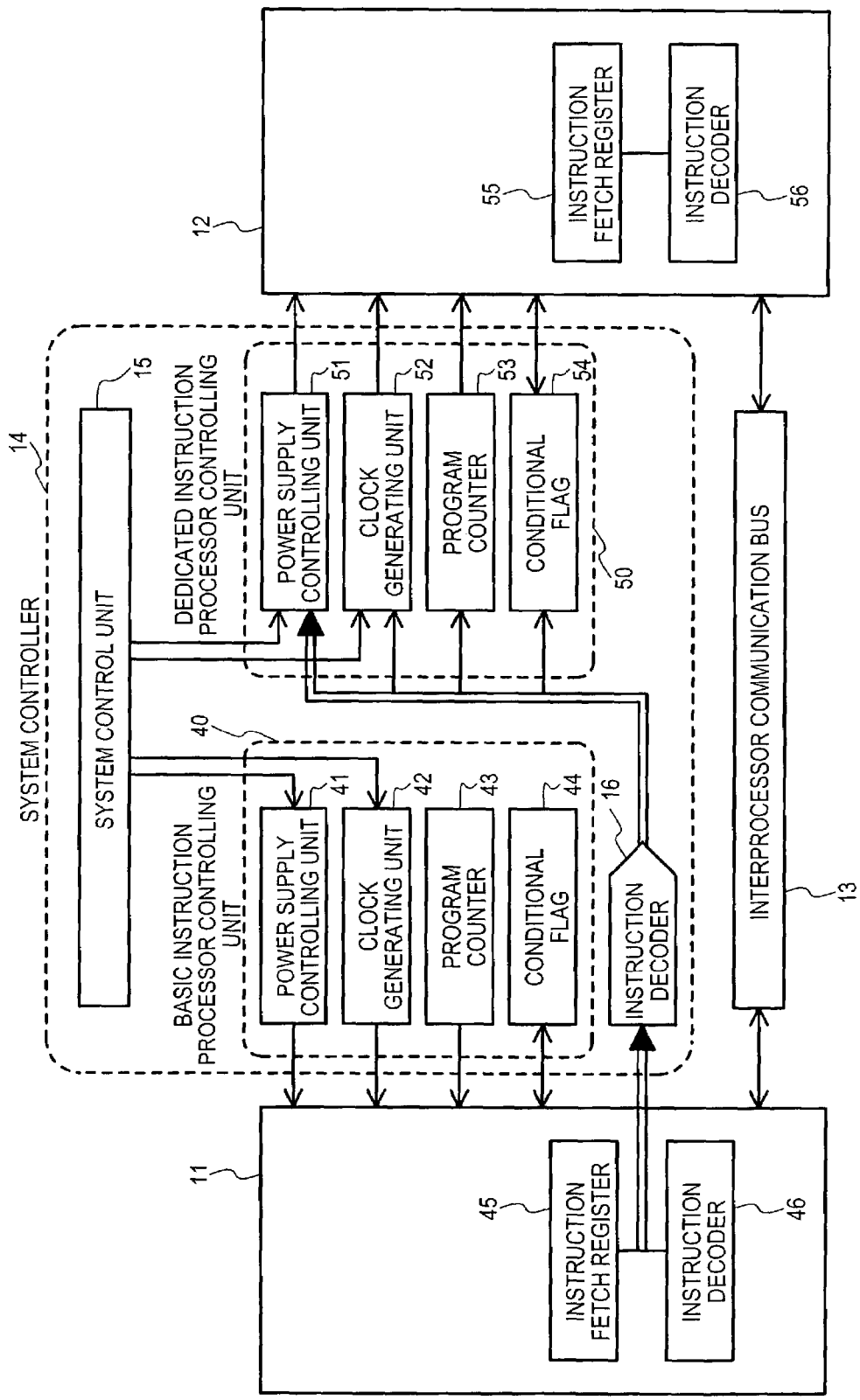
FIG. 3 is a block diagram showing the configuration of a processor according to one embodiment that may result from the method set forth in FIG. 2.

Referring now to FIG. 3, an example of a processor configuration obtained according to the method of FIG. 2 is set forth in a block diagram. Such a processor can include a basic instruction processor 11, a dedicated instruction processor 12, an interprocessor communication bus 13, and a system controller 14. A system controller 14 can include a system control unit 15, an instruction decoder 16, a basic instruction processor controlling unit 40, and a dedicated instruction processor controlling unit 50.

One skilled in the art would realize that while a processor configuration like that of FIG. 3 may form part of a system LSI, such a processor configuration may also be realized as data on machine readable media.

A basic instruction processor 11 can include a first instruction fetch register 45 and a first instruction decoder 46. A dedicated instruction processor 12 can include a second instruction fetch register 55 and a second instruction decoder 56. Basic instruction processor 11 and dedicated instruction processor 12 can transfer data between each other through an interprocessor communication bus 13. Features of an interprocessor communication bus 13, such as communication bandwidth and number of simultaneously accessible data, and the like, can be determined by interprocessor communication interface description 4 based on the basic instruction processor description 2 and the dedicated instruction processor description 3.

Within a system controller 14, a system control unit 15 can receive as inputs, a power supply and a basic clock signal. In addition, an instruction decoder 16 can control a dedicated instruction processor controlling unit 50. In particular, an instruction decoder 16 can refer to an instruction within first instruction fetch register 45. When such an instruction directs control of the dedicated instruction processor 12, the instruction decoder 16 decodes such an instruction.

A basic instruction processor controlling unit 40 can include a first power supply controlling unit 41, a first clock generating unit 42, a first program counter 43, and a first conditional flag 44. Similarly, a dedicated instruction processor controlling unit 50 can include a second power supply controlling unit 51, a second clock generating unit 52, a second program counter 53, and a second conditional flag 54.

Power supply controlling units 41 and 51 provide power supply voltages suitable for the basic instruction processor 11 and dedicated instruction processor 12, respectively. In a similar fashion, first and second clock generating units (42 and 52) supply clock signals suitable for the basic instruction processor 11 and dedicated instruction processor 12, respectively.

First and second program counters (43 and 53) can specify addresses at which instruction fetch registers read out instructions, advance instructions, and processors execute instructions by counting. First program counter 43 provides such functions for the basic instruction processor 11, while second program counter 53 provides such functions for the dedicated instruction processor 12. First and second conditional flags 44 and 54 can set internal states of the basic instruction processor 11 and dedicated instruction processor 12, respectively. Bit widths of program counters (43 and 53), and the number of states to be set in conditional flags (44 and 54) can be determined according to a system controller description 5, which can be established on the basis of the basic instruction processor description 2 and dedicated instruction processor 3.

Figure 4:
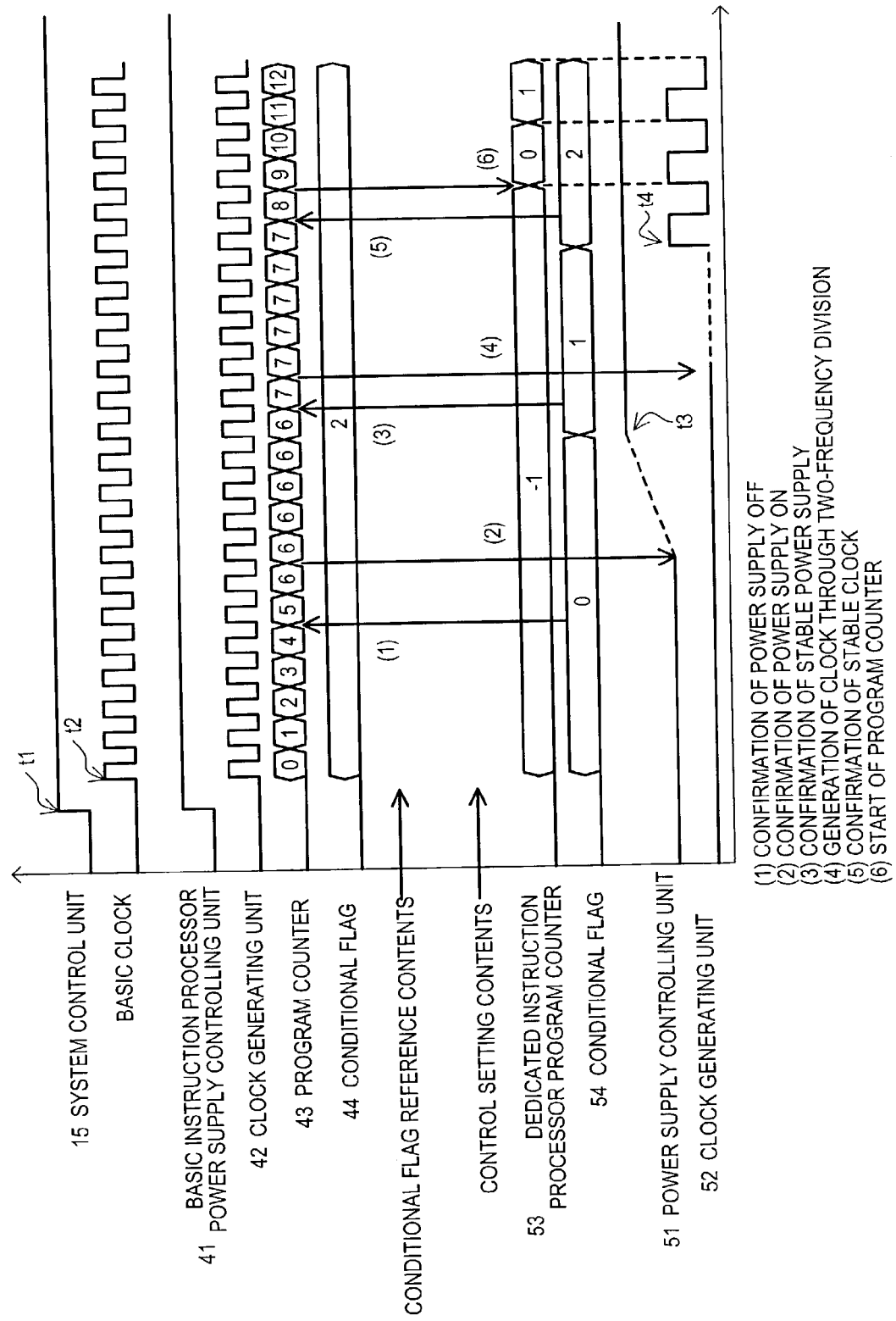
FIG. 4 is a timing diagram showing one example of the operation of a processor like that shown in FIG. 3.
Figure 5:
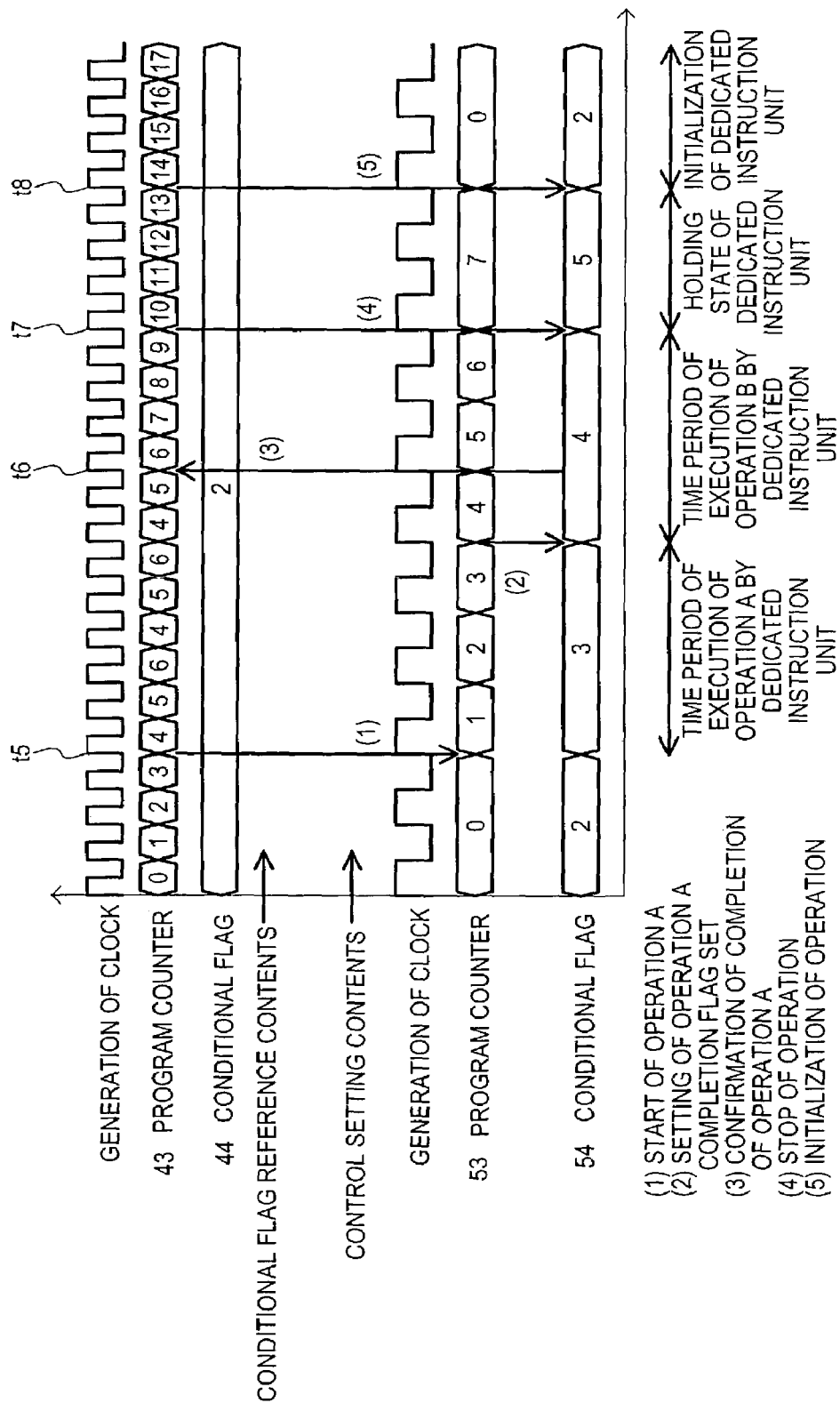
FIG. 5 is a timing diagram showing another example of the operation of a processor like that shown in FIG. 3.
Figure 6:
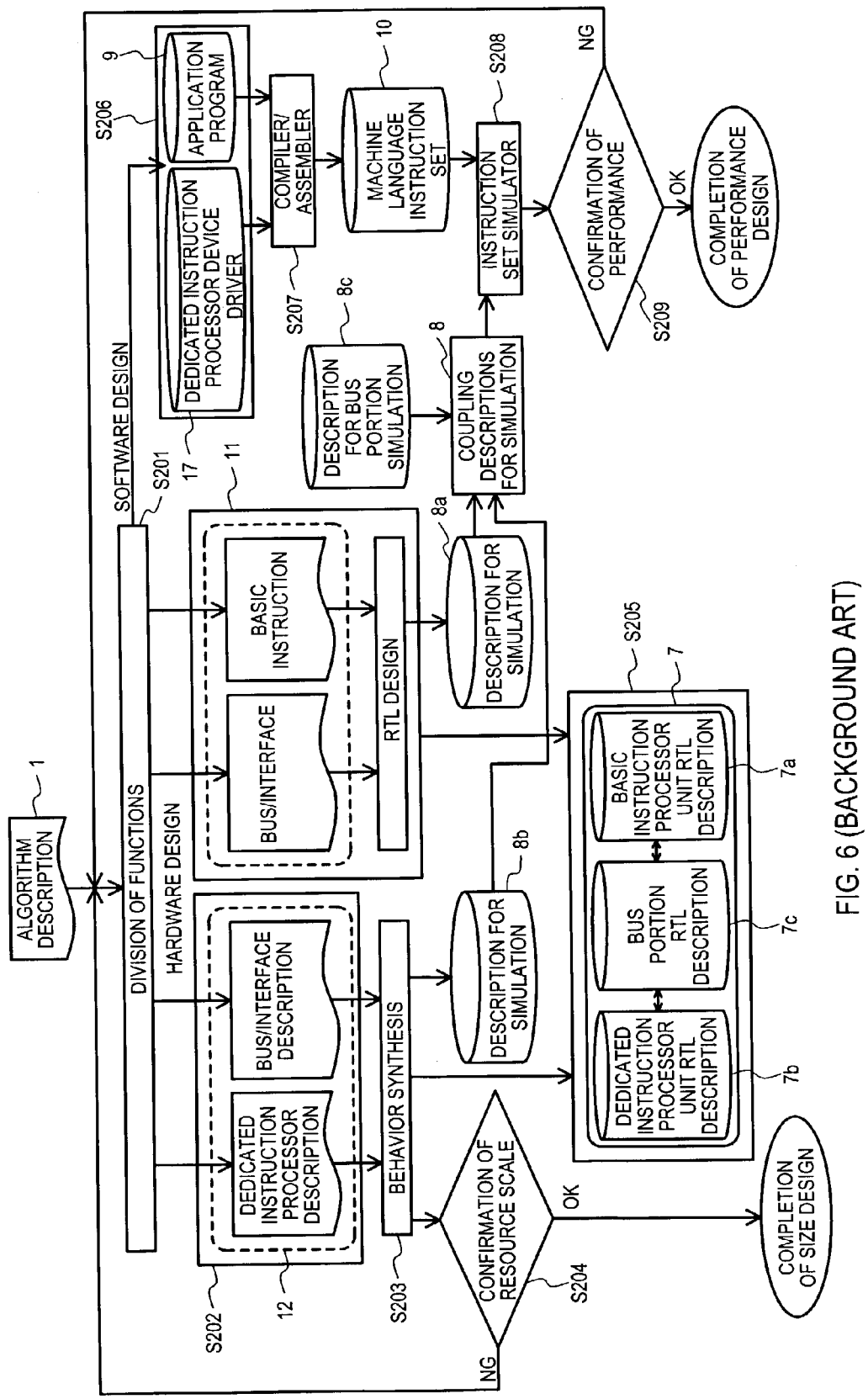
FIG. 6 is a flow chart showing a procedure of a conventional method of designing a system LSI.
Figure 7:
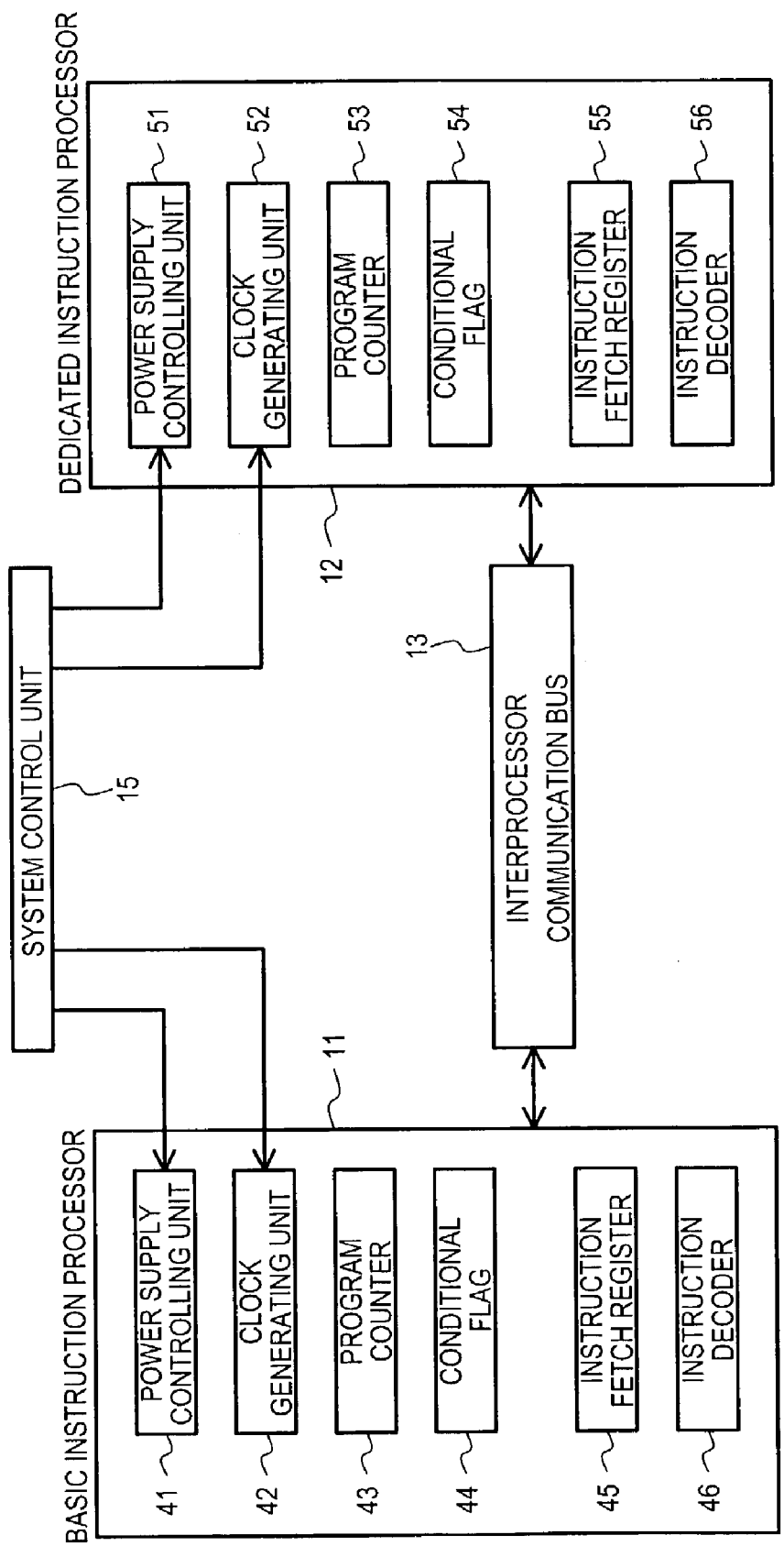
FIG. 7 is a block diagram showing the configuration of a conventional processor designed with the method set of FIG. 6.

Referring now to FIGS. 4 and 5, timing diagrams are set forth showing the operation of a processor like that shown in FIG. 3. The operation of a system LSI according to one embodiment will now be described with reference to FIGS. 3, 4 and 5. For the following description, it will be assumed that conditional flags 44 and 54 represent the following processor states.

TABLE 1

| Conditional Flag | State of Processor |
| --- | --- |
| 0 | Both power supply and clock signal are in an OFF state |
| 1 | Power supply is in an ON state, and clock signal is in an OFF state |
| 2 | Both power supply and clock signal are in an ON state |
| 3 | Operation "A" is being executed |
| 4 | Operation "B" is being executed |
| 5 | On Hold |

The example of FIG. 4 shows a system LSI according to an embodiment being activated. Subsequent to the activation of the system LSI, a dedicated instruction processor 12 is switched from a standby mode to an active mode according to an instruction. However, unlike conventional approaches, such an instruction is decoded by instruction decoder 16 of a system controller 14.

In the very particular example of FIG. 4, when the contents of first program counter 43 reach "4", the instruction decoder 16 issues an instruction that confirms that a power supply of the dedicated instruction processor 12 is in an OFF state. Subsequently, when the first program counter 43 reaches "6", the instruction decoder 16 issues an instruction to turn ON the power supply of the dedicated instruction processor 12. Also, when the first program counter 43 reaches "7", the instruction decoder 16 issues an instruction to turn ON the clock for the dedicated instruction processor 12. Still further, when the first program counter 43 reaches "8", the instruction decoder 16 instructs the dedicated instruction processor 12 to begin processing operations.

Referring still to FIG. 4, at time t1 a system LSI is activated, resulting in power being supplied to a system control unit 15. Power supplied to a system control unit 15 can be supplied, essentially immediately, to a basic instruction processor 11 by way of a first power supply controlling unit 41 of the basic instruction processor controlling unit 40.

At time t2, a basic clock supplied to a system control unit 15 can reach a stable state. From such basic clock, a first clock generating unit 42 can supply a clock to a basic instruction processor 11. Such a clock may have the same essentially frequency and/or duty cycle as the basic clock.

During times t1 and t2, a dedicated instruction processor 12 can maintain a standby mode in which a power supply and a clock signal are not supplied to a dedicated instruction processor 12 until activated by an instruction decoder 16.

Once a basic instruction processor 11 receives a stable power supply and clock signal, within system controller 14 first conditional flag 44 can be set to "2" (see Table 1). As a result, a first program counter 43 can begin to advance. A first instruction fetch register 45 can read out an instruction from a program memory on the basis of a first program counter 43, and store such an instruction in the first instruction fetch register 45. When an instruction fetched from a program memory is for the basic instruction processor 11, the instruction is decoded by first instruction decoder 46 of the basic instruction processor 11. However, when an instruction fetched from a program memory is for controlling the dedicated instruction processor controlling unit 50, the instruction is decoded by instruction decoder 16 of the system controller 14.

Referring still to the example of FIG. 4 in conjunction with FIGS. 3 and 5, when the contents of a first program counter 43 have become "4", the instruction decoder 16 issues an instruction to examine second conditional flag 54 to confirm that a power supply and clock signal are not supplied to the dedicated instruction processor 12 (in this particular example, confirm that the second conditional flag 54 is "0"—see Table 1).

When the contents of a first program counter 43 have become "6", the instruction decoder 16 issues an instruction to the second power supply controlling unit 51 to turn on the power supply to the dedicated instruction processor 12. Until the contents of second conditional flag 54 become a "1" (indicating the power supply is in an ON state and stable—see Table 1), the first program counter 43 can stop a count-up operation, thus waiting for the power supply of the dedicated instruction processor to be established.

At time t3, a power supply from second power supply controlling unit 51 is stable, thus a second conditional flag 54 can become "1". This can restart a count-up by first program counter 43. When the contents of a first program counter 43 have become "7", the instruction decoder 16 instructs second clock generating unit 52 to supply a clock signal to the dedicated instruction processor 12. Until the contents of second conditional flag 54 become a "2" (indicating that both the power supply and clock signal are ON and stable—see Table 1), the first program counter 43 can once again stop a count-up operation, thus waiting for the clock signal and power supply of the dedicated instruction processor 12 to be established.

In the very particular example of FIG. 4, a clock signal supplied to a dedicated instruction processor 12 can be obtained by frequency dividing a basic clock signal, input to system control unit 15, by a factor of two. Of course, such a particular arrangement should not be construed as limiting the invention.

At time t4, the clock signal for the dedicated instruction processor 12 is stable, thus the contents of second conditional flag 54 can become "2". As a result, a first program counter 43 can resume a count-up operation. When the contents of a first program counter 43 have become "8", the instruction decoder 16 can specify a particular initial address at which the second program counter 53 can begin a count-up operation. Dedicated instruction processor 12 can read out an instruction from second instruction fetch register 55 in correspondence to the advance of a second program counter 53. Such an instruction can then be decoded by second instruction decoder 56 to thereby execute the instruction. In the particular example of FIG. 4, a basic instruction processor 11 can continue a count-up operation of a first program counter 43 to thereby execute processing independently of a dedicated instruction processor 12.

In the embodiment of FIGS. 3, 4 and 5, an instruction decoder 16 of a system controller 14 can refer to contents of a first instruction fetch register 45 of a basic instruction processor 11 to thereby decode an instruction. In other words, a dedicated instruction processor 12 can be controlled in accordance with an instruction issued to a basic instruction processor 11. For this reason, in a system LSI of this embodiment, processing can be essentially equal to a process in which a basic instruction processor 11 directly controls a dedicated instruction processor 12 at the clock cycle level. As a result, the number of clock cycles required to switch the operation modes of a dedicated instruction processor 12 can be reduced, and hence a resulting system LSI can have lower power consumption than conventional approaches. In addition, software for carrying out power supply management for a processor may be more easily developed than conventional approaches.

Referring now to FIG. 5, in the particular example shown, a basic instruction processor 11 can instruct dedicated instruction processor 12 to start an operation "A" and then stop the operation of the dedicated instruction processor 12.

Referring now to FIG. 5 in conjunction with FIG. 3, when the contents of a first program counter 43 are "3", a basic instruction processor 11 (by operation of instruction decoder 16) instructs dedicated instruction processor 12 to start operation "A". When the contents of first program counter 43 are "5", the completion of operation "A" can be confirmed.

When the contents of first program counter 43 are "9", a basic instruction processor 11 instructs the dedicated instruction processor 12 to hold operations. Still further, when the contents of first program counter 43 are "13", a basic instruction processor 11 instructs the dedicated instruction processor 12 to stop operations (e.g., an initialize command).

Referring still to FIG. 5, at time t5 an instruction decoder 16 instructs dedicated instruction processor 12 to start an operation "A" and start count-up operations of second program counter 53. In addition, second conditional flag 54 can be set to "3". Within basic instruction processor 11, a first program counter 43 can repeat a loop from count "4" to "6" until dedicated instruction processor 12 completes the operation "A". In this way, the basic instruction processor 11 can wait for the completion of operation "A".

When the contents of second program counter 53 are "3", dedicated instruction processor 12 can complete operation "A", and then start the execution of another operation "B". In addition, second conditional flag 54 is set to "4" (see Table 1).

At time t6, a basic instruction processor 11 can confirm the completion of operation "A" and exit the loop from count "4" to "6", and thus increment a first program counter 43 to "7". As a result, in response to a new instruction, instruction decoder 16 can stop the count-up of second program counter 53 at time t7, and instruct dedicated instruction processor 12 to hold operation "B", and set second conditional flag 54 to "5".

At time t8, an instruction decoded by instruction decoder 16 can decrement the contents of second program counter 53 to "0", and reset (i.e., initialize) the operation of dedicated instruction processor 12. In addition, second conditional flag 54 can be set to "2".

In the example of FIG. 5, a system controller 14 can have a direct indication of the state of dedicated instruction processor 12, thus the basic instruction processor 11 can have an essentially direct indication of the state of dedicated instruction processor 12. Further, in a system LSI according to an embodiment, a basic instruction processor 12 can grasp and set the state of the second conditional flag 54 in an essentially arbitrary fashion. Still further, a system controller 14 can also stop the advance of a second program counter 53 to thereby place the dedicated instruction processor 12 into a holding state.

A system controller 14 of a system LSI according to the present invention can determine a number of features of the system LSI, including the structure of instructions by which a dedicated instruction processor 12 can be controlled, the manner by which a value of second conditional flag 54 can be set, and the like. Such features can be established according to a system controller description (shown as 5 in FIG. 1). Thus, the configuration of a system controller 14 has flexibility in design.

Referring back to FIG. 1, it is noted that when a designing a system LSI according to embodiments of the present invention, a basic instruction processor description 2, interprocessor communication interface description 4, and system controller description 5 can be in the form of previously produced models. A dedicated instruction processor description 3 may then be added to such pre-existing models to obtain a processor description 6. For example, in one approach, a number of various models can be prepared, and one such model is selected and combined with a dedicated instruction processor description 3 to arrive at a processor description 6. In this way, the time required for designing a processor of a system LSI may be shortened.

In addition, when a dedicated instruction processor description 3 has been selected, consideration is given to the resources, control method, and the like, for such a dedicated instruction processor description 3. In response to such considerations, an interprocessor communication interface description 4 and/or system controller description 5 may be modified. Such modifications can include corrections and/or additional description information.

It is also understood that while the above embodiments have illustrated system LSI arrangements that include one basic instruction processor (e.g., 11) and one dedicated instruction processor (e.g., 12), the present invention may also include a basic instruction processor in combination with multiple dedicated instruction processors. In such a case, a system controller (e.g., 14) can include a dedicated instruction processor controlling unit (e.g., 50) corresponding to each different dedicated instruction processor. Each dedicated instruction processor controlling unit may then carry out various control operations for a corresponding dedicated instruction processor. Such control operations may include controlling a power supply, a clock and/or clock frequency, and/or establishing conditional flags therefor.

Still further in a system LSI with multiple dedicated instruction processors according to the present invention, a basic instruction processor can individually control each dedicated instruction processor by operation of an instruction decoder (e.g., 16). For example, a basic instruction processor can command some (e.g., one or more) of the dedicated instruction processors into a standby (e.g., holding) mode, while commanding others (e.g., one or more) into active modes. Still further, a basic instruction processor can command some dedicated instruction processors into a standby mode in which a power supply and a clock signal are not supplied to such dedicates instruction processor(s), while other dedicated instruction processors can be placed into a standby mode in which a power supply is provided, but a clock signal is not (e.g., see Table 1, conditional flags "0" and "1").

As set forth above, in a system LSI, method of designing the same, and a computer program embodied on computer-readable recording medium according to the present invention, a system controller can directly control a dedicated instruction processor. Thus, processing for such an LSI can be essentially equal to a process in which a basic instruction processor directly controls the operation of a dedicated instruction processor at a clock cycle level. In this way it can be possible to shorten the amount of time required to confirm an operation state of a dedicated instruction processor, thus realizing lower power consumption than conventional approaches.

While the present invention has been described in a preferred embodiment, a system LSI, method of designing the same, and a computer program embodied on computer-readable recording medium according to the present invention should be construed as limited to such particular embodiments. The present invention may include various changes and modifications of such particular embodiments. As but one example, dedicated hardware designed with conventional methods for executing specific processing may be added to the processor designed in the above disclosed embodiments.

Thus, while various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A system large scale integrated circuit (LSI), comprising:
    a basic instruction processor having a first instruction decoder that decodes an instruction;
    a dedicated instruction processor having a second instruction decoder that decodes an instruction, said dedicated instruction processor being switched to one of a standby mode and an active mode, in response to an operation control instruction provided to said first instruction decoder;
    a bus coupled between the basic instruction processor and said dedicated instruction processor, to transfer information there between; and
    a third instruction decoder receiving said operation control instruction provided to said first instruction decoder and outputting a decoded output based on said operation control instruction, and said third instruction decoder coupled to said dedicated instruction processor to switch dedicated instruction processor into one of said standby mode and said active mode, in response to said decoded output from said third instruction decoder.

2. The system LSI circuit of claim 1, wherein:
    said third decoder outputs said decoded output without using said bus coupled between said basic instruction processor and said dedicated instruction processor.

3. The system LSI circuit of claim 1, further comprising:
    a power supply controlling unit that controls a power supply to said dedicated instruction processor in response to said decoded output.

4. The system LSI circuit of claim 1, further comprising:
    a clock signal generating unit that controls a clock supply to said dedicated instruction processor, in response to said decoded output.

5. The system LSI circuit of claim 1, further comprising:
    a power supply controlling unit that controls a power supply to said dedicated instruction processor, in response to said decoded output, and a clock signal generating unit that controls a clock supply to said dedicated instruction processor, in response to said decoded output.

6. The system LSI circuit of claim 5, further comprising:
an additional power supply controlling unit and an additional clock generating unit, which are dedicated for said basic instruction processor.

7. The system LSI circuit of claim 1, further comprising:
a conditional flag that indicates the operational states of said dedicated instruction processor.

8. The system LSI circuit of claim 1, further comprising:
a program counter that responds to said decoded output, to designate an instruction to be fetched in said first instruction decoder.

9. The system LSI circuit of claim 8, further comprising:
an additional program counter, which is dedicated for said dedicated instruction processor.

10. The system LSI circuit of claim 8, further comprising:
a conditional flag that indicates operational states of the basic instruction processor.

11. A method of controlling a dedicated instruction processor, which is coupled via a bus to a basic instruction processor, to one of a standby mode and an active mode, comprising:
decoding an operation control instruction by an extra instruction decoder that is provided independently of instruction decoders of said basic instruction processor and said dedicated instruction processor; and
switching said dedicated instruction processor to one of said standby mode and said active mode in response to a decoded output from said extra instruction decoder.

12. The method of claim 11, wherein:
the dedicated instruction processor is switched to one of said standby mode and said active mode, by controlling a power supply to said dedicated instruction processor.

13. The method of claim 11, wherein:
said dedicated instruction processor is switched to one of said standby mode and said active mode, by controlling a clock supply to said dedicated instruction processor.

14. The method of claim 11, wherein:
said dedicated instruction processor is switched to one of said standby mode and said active mode, by controlling a power supply and a clock supply to said dedicated instruction processor.

15. A system large scale integrated circuit (LSI) designing method, comprising the steps of:
providing a description of a basic instruction processor having a first instruction decoder that decodes an instruction at an algorithm level;
providing a description of at least one dedicated instruction processor having a second instruction decoder that decodes an instruction at an algorithm level;
providing a description of a bus at the algorithm level that connects the basic instruction processor and dedicated instruction processor;
providing a description of a third instruction decoder receiving said operation control instruction provided to said first instruction decoder, and outputting a decoded output based on said operation control instruction, and said third instruction decoder coupled to said dedicated instruction processor to switch dedicated instruction processor into one of said standby mode and said active mode, in response to said decoded output from said third instruction decoder; and
synthesizing the description of the basic instruction processor, the description of at least one dedicated instruction processor, and the description of a third decoder to form a lower level language description thereof.

16. The system LSI designing method of claim 15, wherein:
providing the description of the basic instruction processor includes accessing a preexisting processor design stored in a database;
providing the description of the decoder includes
providing at least a first portion of the description of the third decoder by accessing at least a portion of a preexisting third decoder design stored in the database, and
providing at least a second portion of the third decoder by designing said second portion of the description according to the description of the at least one dedicated instruction processor; and
providing the description of the at least one dedicated instruction processor includes designing said descriptions of the at least one dedicated instruction processor according to the desired system LSI function.

17. The system LSI designing method of claim 16, further including:
providing descriptions for a plurality of dedicated instruction processors by designing said descriptions of the dedicated instruction processors according to the desired system LSI function; and
providing the description of the system controller includes providing at least a second portion of the description of the third decoder by designing said second portion of the description according to the description of each dedicated instruction processor.

18. The system LSI designing method of claim 17, further including:
the step of synthesizing further forms a single description for simulation at a clock level for the basic instruction processor, the at least one dedicated instruction processor, the bus, and the third decoder; and
verifying the operation of the system LSI according to the description for simulation and a machine language instruction set readable by a basic instruction processor and dedicated instruction processor of the description for simulation.

19. The system LSI designing method of claim 15, wherein:
the description of the basic instruction processor, and the third decoder are in a form selected from the group consisting of: the C language, an extended version of the C language, or an object oriented language.

20. The system LSI designing method of claim 15, wherein:
the steps of the system LSI designing method comprise a computer program embodied on computer-readable medium executable by a computing system.

21. The system large scale integrated (LSI) circuit, comprising:
a basic instruction processor;
a dedicated instruction processor being switched to one of a standby mode and an active mode in response to an operation control instruction supplied to the basic instruction processor;
a bus coupled between said basic instruction processor and said dedicated instruction processor, to transfer information there between; and
a first instruction decoder receiving said operation control instruction supplied to said basic instruction processor and providing a decoded output coupled to said dedicated instruction processor without using said bus coupled between said basic instruction processor and said dedicated instruction processor.

22. The system LSI circuit of claim 21, wherein:
said basic instruction processor has a second instruction decoder that decodes an instruction.

23. The system LSI circuit of claim 22, wherein:
said dedicated instruction processor has a third instruction decoder that decodes said instruction.

24. The system LSI circuit of claim 21, further comprising:
a power supply controlling unit that controls a power supply to said dedicated instruction processor, in response to said decoded output.

25. The system LSI circuit of claim 21, further comprising:
a clock signal generating unit that controls a clock supply to said dedicated instruction processor, in response to said decoded output.

26. The system LSI circuit of claim 21, further comprising:
a power supply controlling unit that controls a power supply to said dedicated instruction processor, in response to said decoded output, and a clock signal generating unit that controls a clock supply to said dedicated instruction processor, in response to said decoded output.

27. The system LSI circuit of claim 21, further comprising:
a program counter that responds to said decoded output, to designate an instruction to be fetched in said first instruction decoder.

28. The system LSI circuit of claim 21, further comprising:
a conditional flag that indicates the operational states of said dedicated instruction processor.

29. The system LSI circuit of claim 28, further comprising:
an additional power supply controlling unit and an additional clock generating unit, which are dedicated for said basic instruction processor.

30. The system LSI circuit of claim 29, further comprising:
an additional program counter, which is dedicated for said dedicated instruction processor.

31. The system LSI circuit of claim 29, further comprising:
a conditional flag that indicates operational states of the basic instruction processor.

32. A method of controlling a dedicated instruction processor, which is coupled via a bus to a basic instruction processor, to one of a standby mode and an active mode, comprising:
decoding an operation control instruction;
outputting a decoded output; and
switching said dedicated instruction processor to one of said standby mode and said active mode, in response to said decoded output without using said bus coupled between said basic instruction processor and said dedicated instruction processor.

33. The method of claim 32, wherein:
the dedicated instruction processor is switched to one of said standby mode and said active mode, by controlling a power supply to said dedicated instruction processor.

34. The method of claim 33, wherein:
said dedicated instruction processor is switched to one of said standby mode and said active mode, by controlling a clock supply to said dedicated instruction processor.

35. The method of claim 33, wherein:
said dedicated instruction processor is switched to one of said standby mode and said active mode, by controlling a power supply and a clock supply to said dedicated instruction processor.

* * * * *